United States Patent
Misaki

(10) Patent No.: US 8,507,916 B2
(45) Date of Patent: Aug. 13, 2013

(54) THIN FILM TRANSISTOR SUBSTRATE, LCD DEVICE INCLUDING THE SAME, AND METHOD FOR MANUFACTURING THIN FILM TRANSISTOR SUBSTRATE

(75) Inventor: Katsunori Misaki, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/698,093

(22) PCT Filed: May 16, 2011

(86) PCT No.: PCT/JP2011/002701
§ 371 (c)(1),
(2), (4) Date: Nov. 15, 2012

(87) PCT Pub. No.: WO2011/155125
PCT Pub. Date: Dec. 15, 2011

(65) Prior Publication Data
US 2013/0056729 A1    Mar. 7, 2013

(30) Foreign Application Priority Data
Jun. 8, 2010    (JP) ............................ 2010-131117

(51) Int. Cl.
*H01L 21/00*    (2006.01)
(52) U.S. Cl.
USPC ............................ 257/71; 257/40; 257/43
(58) Field of Classification Search
USPC ............................ 257/71, 40, 43
See application file for complete search history.

(56) References Cited

U.S. PATENT DOCUMENTS

| | | | |
|---|---|---|---|
| 5,744,864 A * | 4/1998 | Cillessen et al. | 257/749 |
| 6,678,017 B1 * | 1/2004 | Shimomaki et al. | 349/40 |
| 7,060,541 B2 * | 6/2006 | Lee et al. | 438/149 |
| 8,330,156 B2 * | 12/2012 | Yamazaki et al. | 257/43 |
| 8,378,353 B2 * | 2/2013 | Lee et al. | 257/59 |
| 2003/0189401 A1 * | 10/2003 | Kido et al. | 313/504 |
| 2005/0059190 A1 * | 3/2005 | Lee et al. | 438/149 |
| 2008/0315193 A1 | 12/2008 | Kim et al. | |
| 2010/0044701 A1 | 2/2010 | Sano et al. | |
| 2010/0101963 A1 * | 4/2010 | Shindo et al. | 205/464 |
| 2011/0057179 A1 * | 3/2011 | Nowatari et al. | 257/40 |
| 2011/0095288 A1 | 4/2011 | Morosawa et al. | |
| 2011/0180802 A1 | 7/2011 | Morosawa et al. | |
| 2011/0186830 A1 * | 8/2011 | Burroughes et al. | 257/40 |
| 2011/0240989 A1 * | 10/2011 | Sekine et al. | 257/43 |
| 2011/0315968 A1 * | 12/2011 | Nowatari et al. | 257/40 |

(Continued)

FOREIGN PATENT DOCUMENTS

| | | |
|---|---|---|
| JP | 2008-235871 A | 10/2008 |
| JP | 2009-004787 A | 1/2009 |

(Continued)

OTHER PUBLICATIONS

Official Communication issued in International Patent Application No. PCT/JP2011/002701, mailed on Aug. 9, 2011.

*Primary Examiner* — Laura Menz
(74) *Attorney, Agent, or Firm* — Keating & Bennett, LLP

(57) ABSTRACT

A source electrode and a drain electrode are formed by a stack of a titanium layer, a molybdenum nitride layer, an aluminum layer, and a molybdenum nitride layer, the titanium layer is formed by dry etching, and an oxide semiconductor layer is formed by performing annealing in an oxygen-containing atmosphere after formation of the source electrode and the drain electrode.

12 Claims, 12 Drawing Sheets

(56) References Cited

U.S. PATENT DOCUMENTS

| | | | |
|---|---|---|---|
| 2012/0060909 A1* | 3/2012 | Nagata et al. | 136/256 |
| 2012/0061652 A1* | 3/2012 | Sugisawa et al. | 257/40 |
| 2012/0074414 A1* | 3/2012 | Lee et al. | 257/59 |
| 2012/0199891 A1* | 8/2012 | Suzuki et al. | 257/288 |
| 2012/0223302 A1* | 9/2012 | Yukinobu et al. | 257/43 |
| 2012/0241750 A1* | 9/2012 | Chikama et al. | 257/71 |
| 2012/0313055 A1* | 12/2012 | Yukinobu et al. | 252/519.5 |
| 2013/0023087 A1* | 1/2013 | Yamazaki et al. | 438/104 |
| 2013/0056729 A1* | 3/2013 | Misaki | 257/43 |
| 2013/0087795 A1* | 4/2013 | Terai et al. | 257/59 |

FOREIGN PATENT DOCUMENTS

| | | |
|---|---|---|
| JP | 2009-266938 A | 11/2009 |
| JP | 2010-016163 A | 1/2010 |
| JP | 2010-114413 A | 5/2010 |

* cited by examiner

THIN FILM TRANSISTOR SUBSTRATE, LCD DEVICE INCLUDING THE SAME, AND METHOD FOR MANUFACTURING THIN FILM TRANSISTOR SUBSTRATE

TECHNICAL FIELD

The present invention relates to thin film transistor (TFT) substrates, liquid crystal display (LCD) devices including the same, and methods for manufacturing the TFT substrate, and more particularly to TFT substrates having TFTs using a semiconductor layer comprised of an oxide semiconductor, LCD devices, and method for manufacturing the TFT substrate.

BACKGROUND ART

In recent years, in TFT substrates forming LCD devices, TFTs using a semiconductor layer comprised of an oxide semiconductor (hereinafter referred to as the "oxide semiconductor layer") and having satisfactory characteristics such as high mobility, high reliability, and a low off-state current have been proposed as switching elements of pixels as a minimum unit of an image, instead of conventional TFTs using a semiconductor layer comprised of amorphous silicon.

A typical TFT with a bottom gate structure includes a gate electrode formed on, e.g., a glass substrate, a gate insulating film provided so as to cover the gate electrode, a semiconductor layer provided on the gate insulating film so as to overlap the gate electrode, and source and drain electrodes provided on the gate insulating film so as to overlap the semiconductor layer with a gap between the source and drain electrodes, and a channel region is formed in a portion of the semiconductor layer which is exposed between the source and drain electrodes. The source and drain electrodes preferably uses a stacked structure of, e.g., a titanium layer, an aluminum layer, and a titanium layer (Ti/Al/Ti) in order to reduce resistance as much as possible and to prevent the semiconductor layer and a pixel electrode from mutually changing characteristics.

A channel etch TFT is known as such a TFT with the bottom gate structure. The number of photomasks required to form the channel etch TFT is smaller than that required to form an etch stopper TFT that includes a channel protective film functioning as an etch stopper, because the channel etch TFT does not have the channel protective film. Accordingly, the channel etch TFT is advantageous in terms of manufacturing cost. A channel etch TFT is also disclosed in, e.g., Patent Document 1 as a TFT using an oxide semiconductor layer.

CITATION LIST

Patent Document

PATENT DOCUMENT 1: Japanese Patent Publication No. 2009-4787

SUMMARY OF THE INVENTION

Technical Problem

The oxide semiconductor layer easily dissolves in an acid etchant that is commonly used to wet etching the source and drain electrodes. Accordingly, in the channel etch TFT using the oxide semiconductor layer, the source and drain electrodes are patterned by dry etching.

In this case, however, since the channel region of the oxide semiconductor layer, which is exposed from the source and drain electrodes, is exposed to plasma, the channel region is subjected to plasma damage due to elimination of oxygen from the oxide semiconductor layer by plasma heat, etc. This causes oxygen deficiency in the oxide semiconductor layer, and lattice defects are likely to be produced in the oxide semiconductor layer. This results in an increased off-state current, decreased electron mobility, an increased threshold voltage, hysteresis, etc., and thus degrades TFT characteristics even though the oxide semiconductor layer is used.

Performing annealing in the atmosphere after formation of the source and electrodes can repair the lattice defects in the oxide semiconductor layer, and can stabilize characteristics of the oxide semiconductor layer. However, if the source and drain electrodes have, e.g., a stacked structure of a titanium layer, an aluminum layer, and a titanium layer (Ti/Al/Ti) as described above, particles of the aluminum layer diffuse into the titanium layer due to the annealing, whereby the titanium layer changes into a titanium aluminum alloy layer. Thus, the titanium aluminum alloy layer causes a redox reaction with the oxide semiconductor layer, and the oxide semiconductor layer is metallized and an off-state current increases. As a result, the TFT characteristics are degraded.

The present invention was developed in view of the above problems, and it is an object of the present invention to stably ensure satisfactory characteristics of channel etch TFTs using an oxide semiconductor layer.

Solution to the Problem

In order to achieve the above object, according to the present invention, a stacked structure of source and drain electrodes is configured so that the source and drain electrodes do not cause a redox reaction with an oxide semiconductor layer when performing annealing in order to stabilize characteristics of the oxide semiconductor layer.

Specifically, the present invention is directed to: a TFT substrate including a base substrate, and a TFT having a gate electrode provided on the base substrate, a gate insulating film provided so as to cover the gate electrode, an oxide semiconductor layer provided on the gate insulating film so as to overlap the gate electrode, and a source electrode and a drain electrode which are provided on the gate insulating film so as to face each other on the oxide semiconductor layer and so that a part of the source electrode and a part of the drain electrode are connected to the oxide semiconductor layer; an LCD device including the TFT substrate; and a method for manufacturing the TFT substrate, and takes the following measures to solve the problems.

In other words, according to a first invention, the source electrode and the drain electrode have a stack of a first conductive layer, a second conductive layer, and a third conductive layer, the third conductive layer is comprised of a low resistance metal that causes a redox reaction with the oxide semiconductor, the first conductive layer directly contacts the oxide semiconductor layer, is formed by dry etching, and is comprised of a refractory metal including a Group 4 metal element that is less likely to cause the redox reaction with oxide semiconductor than the third conductive layer does, an alloy primarily containing the Group 4 metal element, or a nitride or oxide thereof, the second conductive layer is comprised of a refractory metal including a Group 5 or Group 6 metal element into which metal particles of the third conductive layer are less likely to diffuse than into the first conductive layer, an alloy primarily containing the Group 5 or Group 6 metal element, or a nitride or oxide thereof, and the oxide semiconductor layer is formed by performing annealing in an oxygen-containing atmosphere after formation of the source electrode and the drain electrode.

With the above configuration, the second conductive layer is comprised of the refractory metal including the Group 5 or Group 6 metal element into which the metal particles of the third conductive layer are less likely to diffuse than into the first conductive layer. Thus, when annealing the oxide semiconductor layer, the metal particles of the third conductive layer that causes a redox reaction with the oxide semiconductor do not diffuse into the second conductive layer, and the second conductive layer prevents diffusion of the metal particles of the third metal layer into the first metal layer. The first conductive layer is comprised of the refractory metal including the Group 4 metal element that is less likely to cause a redox reaction with the oxide semiconductor than the third conductive layer does. Accordingly, when performing the annealing, the first conductive layer is less likely to cause a redox reaction with the oxide semiconductor, and reduction and metallization of the oxide semiconductor layer by the source electrode and the drain electrode can be prevented. Thus, the annealing can repair lattice defects in the oxide semiconductor layer, and can reliably stabilize characteristics of the oxide semiconductor layer. Accordingly, satisfactory characteristics can be stably ensured in the channel etch TFT using the oxide semiconductor layer.

According to a second invention, in the TFT substrate of the first invention, the first conductive layer contains titanium (Ti), the second conductive layer contains at least one element selected from molybdenum (Mo), chromium (Cr), niobium (Nb), tantalum (Ta), and tungsten (W), and the third conductive layer contains at least one element selected from aluminum (Al), copper (Cu), and silver (Ag).

With the above configuration, advantages of the present invention can be specifically obtained.

According to a third invention, in the TFT substrate of the first or second invention, the TFT is covered by a protective insulating film comprised of silicon oxide.

With the above configuration, since the protective insulating film comprised of silicon oxide typically has a higher oxygen transmission rate than, e.g., a silicon nitride film, oxygen of the annealing can be effectively supplied to a channel region of the oxide semiconductor layer. Moreover, the protective insulating film is comprised of silicon oxide. This suppresses occurrence of oxygen deficiency in the oxide semiconductor layer due to hydrogen elimination in the film, which may occur in the case where the protective insulating film is comprised of, e.g., silicon nitride.

According to a fourth invention, in the TFT substrate of any one of the first to third inventions, the gate insulating film is comprised of silicon oxide.

The above configuration suppresses occurrence of oxygen deficiency in the oxide semiconductor layer due to hydrogen elimination in the film, which may occur in the case where the gate insulating film is comprised of, e.g., a silicon nitride film.

According to a fifth invention, in the TFT substrate of any one of the first to fourth inventions, the TFT substrate further includes a pixel electrode provided for each TFT, and connected to the drain electrode of the TFT, the source electrode and the drain electrode further have a fourth conductive layer on the third conductive layer, and the fourth conductive layer of the drain electrode is directly connected to the pixel electrode, and a difference in ionization tendency between the fourth conductive layer and the pixel electrode and between the fourth conductive layer and the third conductive layer is smaller than that between the pixel electrode and the third conductive layer.

With the above configuration, the fourth conductive layer reduces the difference in ionization tendency between the drain electrode and the pixel electrode. This suppresses occurrence of a so-called galvanic corrosion phenomenon, which is a phenomenon that occurs due to contact between different kinds of metal having different potentials, between the drain electrode and the pixel electrode.

According to a sixth invention, in the TFT substrate of any one of the first to fifth inventions, the first conductive layer has a thickness in a range of 5 nm to 50 nm, both inclusive.

If the first conductive layer is thinner than 5 nm, the first conductive layer tends to have an insufficient covering property (coverage) on the oxide semiconductor layer. Accordingly, if the second and third conductive layers are formed by wet etching and only the first conductive layer is formed by dry etching, an etchant that is used to form the second and third conductive layers penetrates into the oxide semiconductor layer, and etches the oxide semiconductor layer. As a result, the channel region may disappear or the film may be delaminated.

On the other hand, if the first conductive layer is thicker than 50 nm, the first conductive layer has relatively large variation in thickness upon formation thereof. This increases the exposure time of the channel region of the oxide semiconductor layer to plasma due to overetching that is caused by such variation in thickness. Thus, plasma damage to the channel region is increased, and TFT characteristics can be degraded.

However, with the above configuration, the first conductive layer has a satisfactory covering property on the oxide semiconductor layer. Accordingly, if the first conductive layer is formed by dry etching, the first conductive layer having such a satisfactory covering property can prevent an etchant that is used to form the second and third conductive layers from penetrating into the oxide semiconductor layer, and also reduces the exposure time of the channel region of the oxide semiconductor layer to plasma due to overetching that is caused by variation in thickness of the first conductive layer upon formation thereof. This suppresses plasma damage to the channel region, and satisfactorily suppresses degradation in TFT characteristics.

According to a seventh invention, in the TFT substrate of any one of the first to sixth inventions, the semiconductor layer is comprised of an indium gallium zinc oxide (In—Ga—Zn—O)-based oxide semiconductor.

With the above configuration, satisfactory TFT characteristics such high mobility, high reliability, and a low off-state current are specifically obtained.

According to an eighth invention, an LCD device includes: the TFT substrate of any one of the first to seventh inventions; a counter substrate placed so as to face the thin film transistor substrate; and a liquid crystal layer provided between the TFT substrate and the counter substrate.

With the above configuration, the TFT substrate of the first to sixth inventions stably ensure satisfactory characteristics of the channel etch TFT using the oxide semiconductor layer. Such excellent characteristics of the TFT substrate can improve display quality while suppressing manufacturing cost of the LCD device.

According to a ninth invention, a method for manufacturing the thin film transistor substrate of the first invention includes: a first patterning step of forming the gate electrode by forming a conductive film on the base substrate and patterning the conductive film by using a first photomask; a gate insulating film formation step of forming the gate insulating film so as to cover the gate electrode; a second patterning step of forming the oxide semiconductor layer by forming on the gate insulating film a semiconductor film comprised of an oxide semiconductor, and patterning the semiconductor film by using a second photomask; and a third patterning step of forming the source electrode and the drain electrode by sequentially forming a first conductive film, a second conductive film, and a third conductive film to form a stacked conductive film so as to cover the oxide semiconductor layer, patterning the second and third conductive films of the stacked conductive film by wet etching using a third photomask, and then patterning the remaining first conductive film by dry etching, wherein the first conductive film is comprised of a refractory metal including a Group 4 metal element, an alloy primarily containing the Group 4 metal element, or a nitride or oxide thereof, the second conductive layer is comprised of a refractory metal including a Group 5 or Group 6 metal element, an alloy primarily containing the Group 5 or Group 6 metal element, or a nitride or oxide thereof, and the third conductive layer is comprised of a low resistance metal that causes a redox reaction with the oxide semiconductor, and the substrate having both the source electrode and the drain electrode formed thereon is subjected to annealing in an oxygen-containing atmosphere.

According to the above manufacturing method, only the first conductive layer is patterned by dry etching in the third patterning step. This reduces the exposure time of the channel region of the oxide semiconductor layer to plasma due to overetching that is caused by variation in thickness of the stacked conductive film forming the source and drain electrodes upon formation of the stacked conductive film. Thus, plasma damage to the channel region is suppressed, and degradation in TFT characteristics is satisfactorily suppressed. The second conductive layer is comprised of the refractory metal including the Group 5 or Group 6 metal element into which metal particles of the third conductive layer are less likely to diffuse than into the first conductive layer, and the first conductive layer is comprised of the refractory metal including the Group 4 metal element that is less likely to cause a redox reaction with the oxide semiconductor than the third conductive layer does. This prevents reduction and metallization of the oxide semiconductor layer by the source electrode and the drain electrode when performing the annealing, and the annealing can repair lattice defects in the oxide semiconductor layer and can reliably stabilize characteristics of the oxide semiconductor layer. Thus, satisfactory characteristics can be stably ensured in the channel etch TFT using the oxide semiconductor layer.

According to a tenth invention, the method of the ninth invention further includes: a fourth patterning step of forming a contact hole at a position corresponding to the drain electrode by forming a protective insulating film so as to cover the source electrode and the drain electrode and patterning the protective insulating film by using a fourth photomask; and a fifth patterning step of forming a pixel electrode so as to connect to the drain electrode, by forming on the protective insulating film a conductive film so as to connect to the drain electrode via the contact hole, and patterning the conductive film by using a fifth photomask.

In the above method, the TFT substrate is specifically manufactured by using a total of five photomasks. Thus, the number of photomasks required to manufacture this TFT substrate is smaller than that required to manufacture a TFT substrate having an etch stopper TFT, because the former TFT substrate does not have a channel protective film functioning as an etch stopper. This suppresses manufacturing cost.

According to an eleventh invention, in the method of the tenth invention, the annealing is performed after formation of the protective insulating film in the fourth patterning step.

With the above configuration, oxygen in the channel region of the oxide semiconductor layer may be eliminated when the protective insulating film is formed by a chemical vapor deposition (CVD) method. However, since the annealing is performed after formation of the protective insulating film, oxygen deficiency in the oxide semiconductor layer is effectively made up, and characteristics of the oxide semiconductor layer can be reliably stabilized.

Advantages of the Invention

According to the present invention, the source electrode and the drain electrode do not cause a redox reaction with the oxide semiconductor layer when annealing is performed to stabilize characteristics of the oxide semiconductor layer. Thus, satisfactory characteristics are stably ensured in the channel etch TFT using the oxide semiconductor layer, namely the TFT that can be manufactured at low cost. Applying this TFT substrate to display devices can improve display quality while suppressing manufacturing cost of the display devices.

DESCRIPTION OF EMBODIMENTS

An embodiment of the present invention will be described in detail below with reference to the accompanying drawings. The present invention is not limited to the following embodiment.

[Embodiment of Invention]

Figure 1:
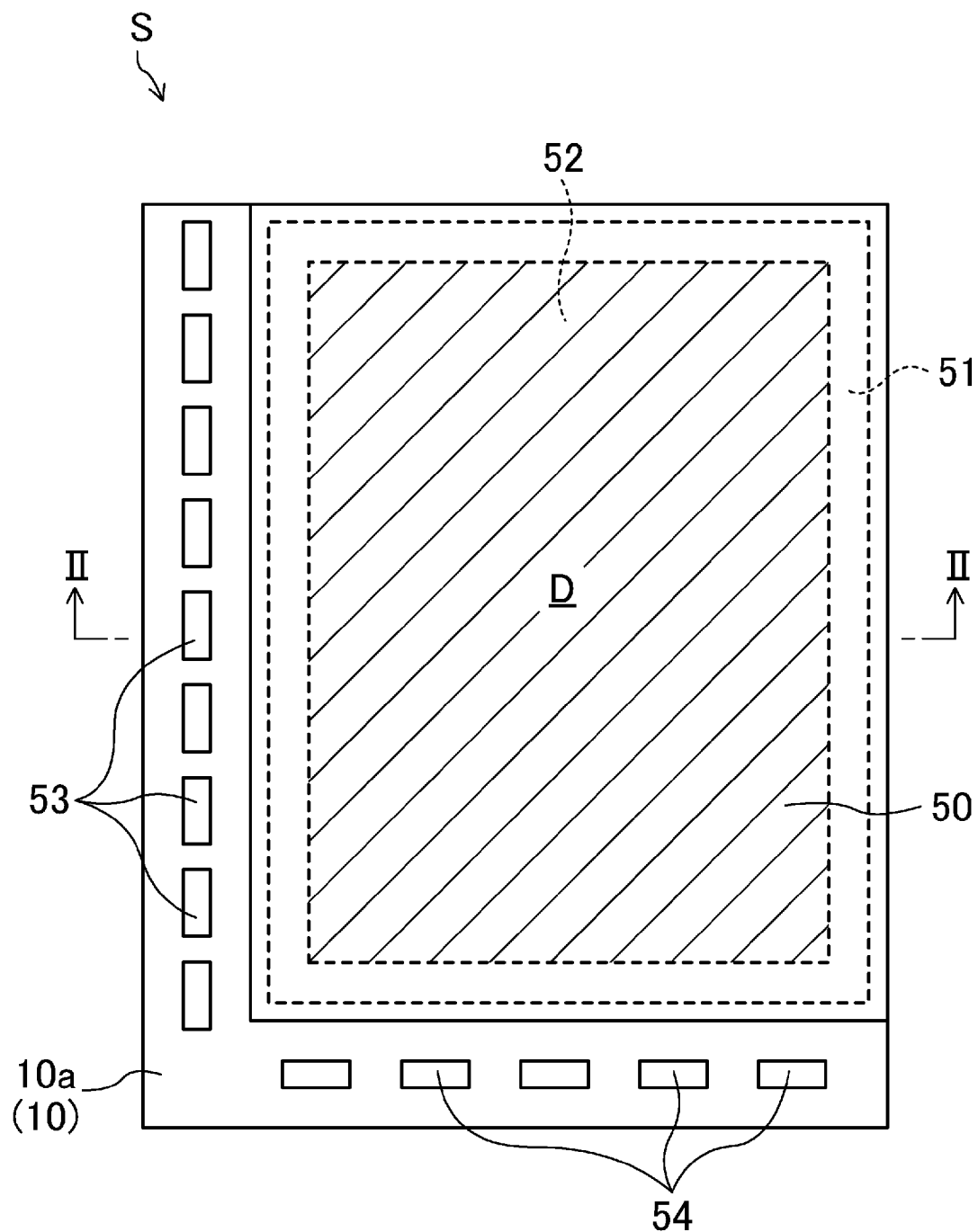
FIG. 1 is a plan view schematically showing an LCD device according to an embodiment.
Figure 2:
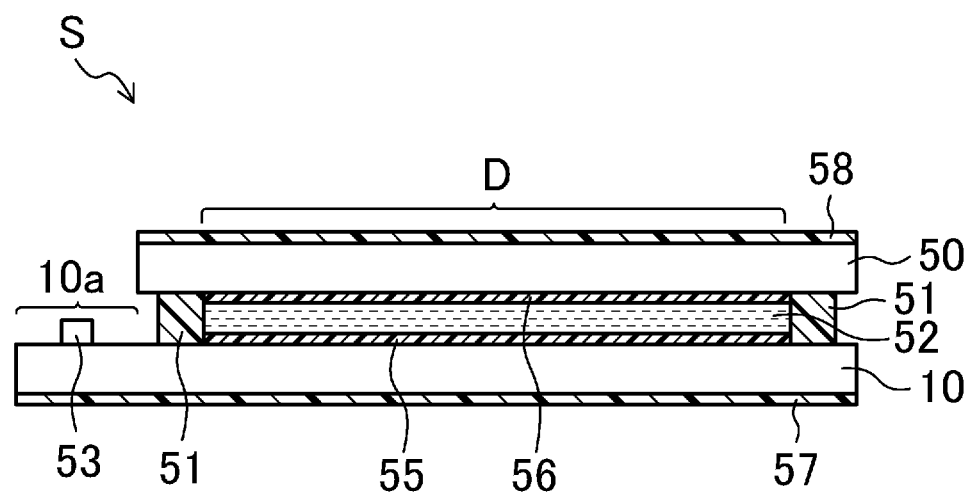
FIG. 2 is a cross-sectional view showing a cross-sectional structure taken along line II-II in FIG. 1.

FIG. 1 is a schematic plan view of an LCD device S according to the present embodiment. FIG. 2 is a schematic cross-sectional view showing a cross-sectional structure taken along line II-II in FIG. 1. A polarizing plate 58 shown in FIG. 2 is not shown in FIG. 1.

(Configuration of LCD Device S)

The LCD device S includes: a TFT substrate 10 and a counter substrate 50 which are placed so as to face each other; a frame-shaped sealant 51 that bonds outer peripheral edges of the TFT substrate 10 and the counter substrate 10; and a liquid crystal layer 52 enclosed between the TFT substrate 10 and the counter substrate 50 by the sealant 51.

This LCD device S is a transmissive LCD device, and a display region D configured to display an image is defined inside the sealant 51 in a region where the TFT substrate 10 overlaps the counter substrate 50, namely in a region where the liquid crystal layer 52 is provided. In a region outside the display region D, the TFT substrate 10 protrudes in, e.g., an L-shape etc. beyond the counter substrate 50, forming a terminal portion 10a.

The display region D is, e.g., a rectangular region, in which a plurality of pixels as a minimum unit of an image are arranged in a matrix pattern. On the other hand, a plurality of gate driver integrated circuits (IC) chips 53 are mounted on one side (the left side in FIG. 1) of the terminal portion 10a with anisotropic conductive films (ACFs) interposed therebetween. A plurality of source driver IC chips 54 are mounted on another side (the lower side in FIG. 1) of the terminal portion 10a with ACFs interposed therebetween.

Each of the TFT substrate 10 and the counter substrate 50 is formed in, e.g., a rectangular shape. As shown in FIG. 2, alignment films 55, 56 are respectively provided on the opposing inner surfaces of the TFT substrate 10 and the counter substrate 50, and polarizers 57, 58 are respectively provided on the outer surfaces of the TFT substrate 10 and the counter substrate 50. The liquid crystal layer 52 is comprised of a nematic liquid crystal material having electrooptical characteristics, etc.

(Configuration of TFT Substrate 10)

Figure 3:
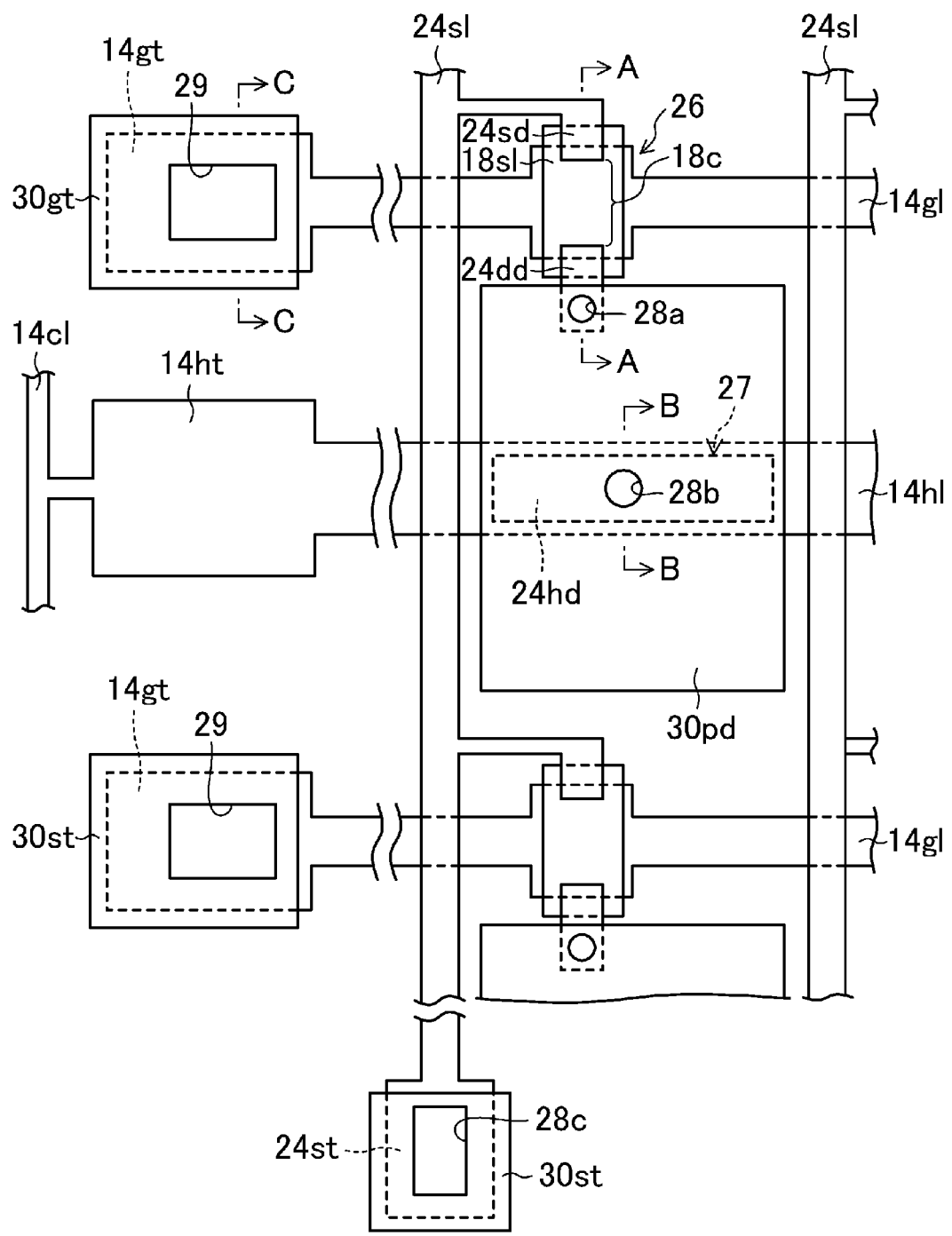
FIG. 3 is a plan view schematically showing a configuration of a pixel and terminal portions of interconnects in a TFT substrate according to the embodiment.
Figure 4:
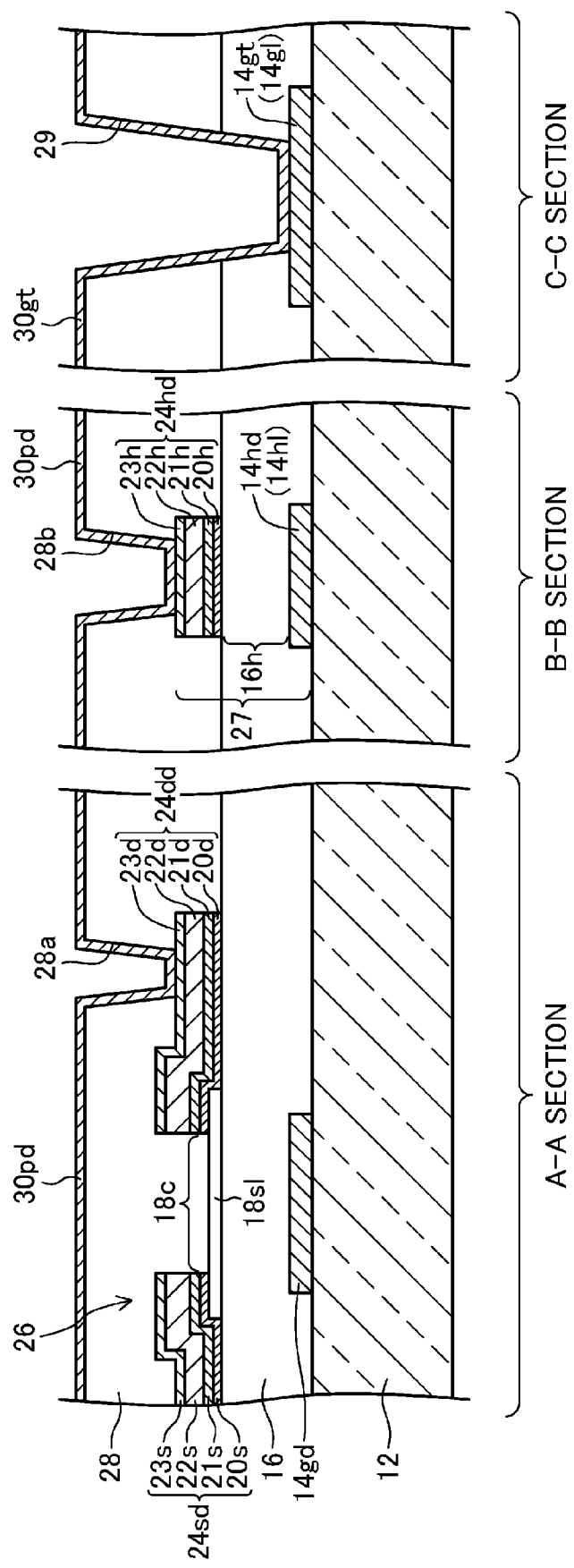
FIG. 4 is a cross-sectional view showing cross-sectional structures taken along lines A-A, B-B, and C-C in FIG. 3.

FIGS. 3 and 4 show schematic configuration diagrams of the TFT substrate 10. FIG. 3 is a plan view showing a pixel and terminal portions of interconnects. FIG. 4 is a cross-sectional view showing cross-sectional structures taken along lines A-A, B-B, and C-C in FIG. 3 in this order from left to right in the figure.

The TFT substrate 10 has an insulating substrate 12 such as a glass substrate as a base substrate shown in FIG. 4. As shown in FIG. 3, in the display region D, the TFT substrate 10 includes, on the insulating substrate 12, a plurality of gate lines 14gl provided so as to extend parallel to each other, a plurality of storage capacitor lines 14hl provided for every gate line 14gl and each extending along a corresponding one of the gate lines 14gl, and a plurality of source lines 24sl provided so as to extend parallel to each other in a direction crossing the gate lines 14gl and the storage capacitor lines 14hl with an insulating film interposed therebetween. The gate lines 14gl and the source lines 24sl are generally arranged in a grid pattern so as to define each pixel. Each storage capacitor line 14hl extends across those pixels arranged in the direction in which the gate lines 14gl extend.

The TFT substrate 10 further includes a TFT 26, a storage capacitor 27, and a pixel electrode 30pd at every intersection of the gate line 14gl and the source line 24sl, namely in every pixel.

Each TFT 26 is a channel etch TFT, and as shown in FIG. 4 (A-A section), includes: a gate electrode 14gd provided on the insulating substrate 12; a gate insulating film 16 provided so as to cover the gate electrode 14gd; an oxide semiconductor layer 18sl provided on the gate insulating film 16 so as to overlap the gate electrode 14gd; and a source electrode 24sd and a drain electrode 24dd which are provided so as to face each other on the oxide semiconductor layer 18sl and so that a part of the source electrode 24sd and a part of the drain electrode 24dd are connected to the oxide semiconductor layer 18sl. A channel region 18c is formed in a part of the oxide semiconductor layer 18sl which is located between the source electrode 24sd and the drain electrode 24dd.

The gate electrode 14gd is a part of the gate line 14gl which forms a corresponding one of the intersections. As shown in FIG. 3, the gate electrode 14gd has a protruding portion protruding on both sides in the lateral direction of the gate line 14gl, and the channel length of the TFT 26 is adjusted by the protruding width of the protruding portion. Although not shown in the figures, the gate electrode 14gd and the gate line 14gl are comprised of a stack of, e.g., an aluminum (Al) layer, a titanium (Ti) layer, and a titanium nitride (TiN) layer, which are sequentially stacked in this order.

The gate insulating film 16 is comprised of, e.g., silicon oxide. This suppresses occurrence of oxygen deficiency in the oxide semiconductor layer 18sl due to hydrogen elimination in the film, which may occur in the case where the gate insulating film 16 is comprised of, e.g., a silicon nitride (SiN) film. The oxide semiconductor layer 18sl is comprised of an In—Ga—Zn—O-based oxide semiconductor.

The source electrode 24sd and the drain electrode 24dd are comprised of a stack of a titanium (Ti) layer 20s, 20d as a first conductive layer, a molybdenum nitride (MoN) layer 21s, 21d as a second conductive layer, an aluminum (Al) layer 22s, 22d as a third conductive layer, and a molybdenum nitride (MoN) layer 23s, 23d as a fourth conductive layer, which are sequentially stacked in this order. The aluminum layer 22s, 22d tends to cause a redox reaction with an oxide semiconductor, and the titanium layer 20s, 20d is less likely to cause a redox reaction with an oxide semiconductor than the aluminum layer 22s, 22d does. Metal particles of the aluminum layer 22s, 22d are less likely to diffuse into the molybdenum nitride layer 21s, 21d, 23s, 23d than into the titanium layer 20s, 20d.

As described in detail below, the titanium layer 20s, 20d is formed by patterning a titanium film, which is formed as a solid film on the entire substrate, by dry etching. The molybdenum nitride layer 21s, 21d, the aluminum layer 22s, 22d, and the molybdenum nitride layer 23s, 23d are formed by patterning a stacked film of a molybdenum nitride film, an aluminum film, and a molybdenum nitride film, which is formed as a solid stacked film on the entire substrate, by wet etching. The thickness of the titanium layer 20s, 20d is preferably in the range of 5 nm to 50 nm, both inclusive, and is, e.g., about 20 nm in order to achieve a satisfactory covering property (coverage) on the oxide semiconductor layer 18sl and to suppress plasma damage to the channel region 18c of the oxide semiconductor layer 18sl due to dry etching that is performed to form the titanium layer 20s, 20d.

As shown in FIG. 4 (B-B section), the storage capacitor 27 includes: a lower electrode 14hd formed by a part of the storage capacitor line 14hl and covered by the gate insulating film 16; a dielectric layer 16h as a part of the gate insulating film 16 which corresponds to the lower electrode 14hd; and an island-shaped upper electrode 24*hd* overlapping the lower electrode 14*hd* with the dielectric layer 16*h* interposed therebetween. The lower electrode 14*hd* and the storage capacitor line 14*hl* have a stacked structure (TiN/Ti/Al) similar to that of the gate line 14*gl* and the gate electrode 14*gd*. The upper electrode 24*hd* has a stacked structure (MoN/Al/MoN/Ti) similar to that of the source electrode 24*sd* and the drain electrode 24*dd*.

As shown in FIG. 4, the TFT 26 and the storage capacitor 27 are covered by a protective insulating film 28 comprised of silicon oxide. Providing the protective insulating film 28 comprised of silicon oxide suppresses occurrence of oxygen deficiency in the oxide semiconductor layer 18*sl* due to hydrogen elimination in the film, which may occur in the case where the protective insulating film 28 is comprised of, e.g., silicon nitride. The pixel electrode 30*pd* is provided on the protective insulating film 28.

The pixel electrode 30*pd* is comprised of indium tin oxide (ITO), and is formed substantially on the entire pixel so as to cover the storage capacitor 27. Contact holes 28*a*, 28*b* are formed in the protective insulating film 28 at positions corresponding to the drain electrode 24*dd* and the upper electrode 24*hd* of each pixel, so as to extend to the electrodes 24*dd*, 24*hd*. Each pixel electrode 30*pd* is connected to the drain electrode 22*dd* and the upper electrode 24*hd* of a corresponding pixel via the contact holes 28*a*, 28*b*. The pixel electrode 30*pd* is directly connected to the molybdenum nitride layers 23*d*, 23*h* as the uppermost layers of the drain electrode 24*dd* and the upper electrode 24*hd*. The difference in ionization tendency between the pixel electrode 30*pd* comprised of ITO and the molybdenum nitride layer 23*d*, 23*h* is smaller than that between the pixel electrode 30*pd* and the aluminum layer 22*d*, 22*h*, and the molybdenum nitride layers 23*d*, 23*h* reduce the difference in ionization tendency between the drain electrode 24*dd* and the pixel electrode 30*pd* and between the upper electrode 24*hd* and the pixel electrode 30*pd*. This suppresses occurrence of a galvanic corrosion phenomenon between the drain electrode 24*dd* and the pixel electrode 30*pd* and between the upper electrode 24*hd* and the pixel electrode 30*pd*. Each gate line 14*gl* is extended to the terminal region 10*a* where the gate driver IC chips 53 are mounted, and a tip end portion of the extended gate line 14*gl* forms a gate terminal portion 14*gt* shown in FIG. 3. The gate terminal portion 14*gt* is connected to a gate connection electrode 30*gt* formed on the insulating film 28, via a contact hole 29 shown in FIG. 4 (C-C section), which is formed in the gate insulating film 16 and the protective insulating film 28. The gate connection electrode 30*gt* forms an electrode that electrically connects to the gate driver IC chip 53.

Each source line 24*sl* is extended to the terminal region 10*a* where the source driver IC chips 54 are mounted, and a tip end portion of the extended source line 24*sl* forms a source terminal portion 24*st* shown in FIG. 3. The source terminal portion 24*st* is connected to a source connection electrode 30*st* formed on the insulating film 28, via a contact hole 28*c* formed in the protective insulating film 28. The source connection electrode 30*st* forms an electrode that electrically connects to the source driver IC chip 54.

Each storage capacitor line 14*hl* is provided so that both ends thereof extend to the region where the sealant 51 is provided, and each of the ends of the storage capacitor line 14*hl* forms a storage capacitor terminal portion 14*ht*. Each storage capacitor terminal portion 14*ht* is connected to a common line 14*cl*, and is electrically connected to a common electrode of the counter substrate 50 described below by so-called common transfer. Thus, each storage capacitor terminal portion 14*ht* forms an electrode that applies to the storage capacitor line 14*hl* a common voltage similar to that of the common electrode.

(Configuration of Counter Substrate 50)

Although not shown in the figures, the counter substrate 50 includes: a black matrix provided in a grid pattern on an insulating substrate as a base substrate so as to correspond to the gate lines 14*gl* and the source lines 24*sl*; color filters of a plurality of colors including red, green, and blue layers periodically arranged between the grid lines of the black matrix; a common electrode provided so as to cover the black matrix and the color filters; and a columnar photo spacer provided on the common electrode.

(Operation of LCD Device S)

In the LCD device S having the above configuration, when the TFT 26 in each pixel is turned on in response to a gate signal sent from the gate driver IC chip 53 to the gate electrode 14*gd* through the gate line 14*gl*, a source signal is sent from the source driver IC chip 54 to the source electrode 24*sd* through the source line 24*sl*, so that a predetermined amount of charge is written to the pixel electrode 30*pd* through the oxide semiconductor layer 18*sl* and the drain electrode 24*dd*, and the storage capacitor 27 is charged. At this time, a potential difference is generated between the pixel electrode 30*pd* of the TFT substrate 10 and the common electrode of the counter substrate 50, whereby a predetermined voltage is applied to the liquid crystal layer 52. When the TFT 26 is off, storage capacitance formed in the storage capacitor 27 suppresses a decrease in voltage written to the corresponding pixel electrode 30*pd*. In the LCD device S, the alignment state of liquid crystal molecules is changed in each pixel according to the magnitude of the voltage applied to the liquid crystal layer 52, whereby light transmittance of the liquid crystal layer 52 is adjusted, and an image is displayed.

Manufacturing Method

Figure 5:
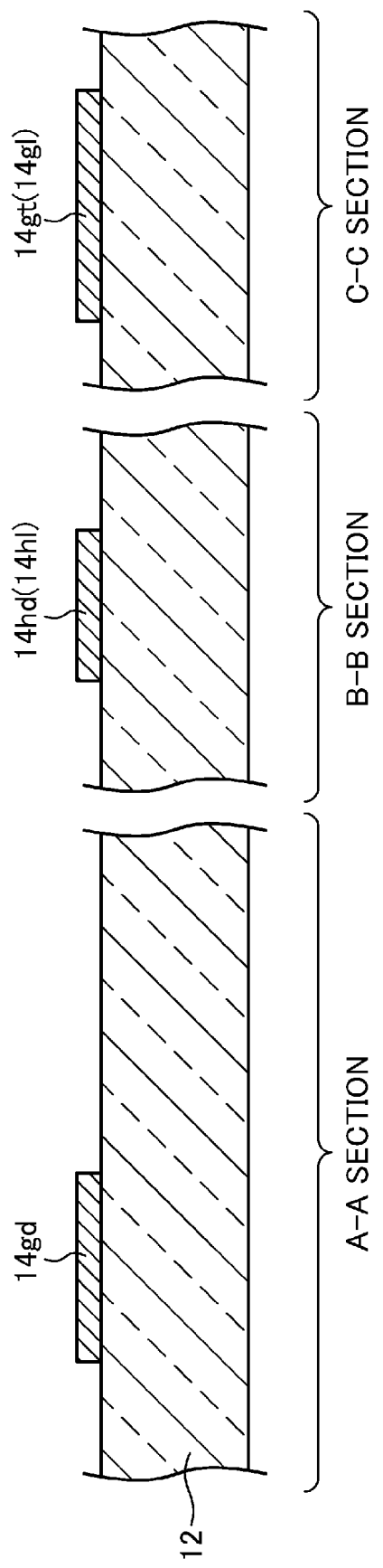
FIG. 5 is a cross-sectional view corresponding to FIG. 4, showing the state where a gate electrode has been formed in a first patterning step in manufacturing of the TFT substrate.
Figure 6:
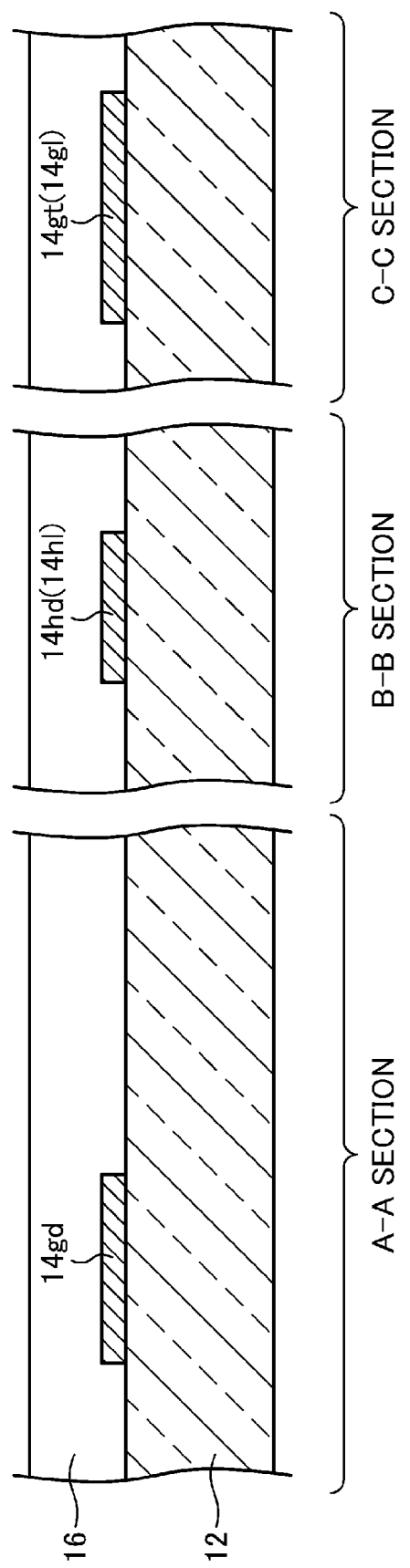
FIG. 6 is a cross-sectional view corresponding to FIG. 4, showing the state where a gate insulating film has been formed in a gate insulating film formation step in manufacturing of the TFT substrate.
Figure 7:
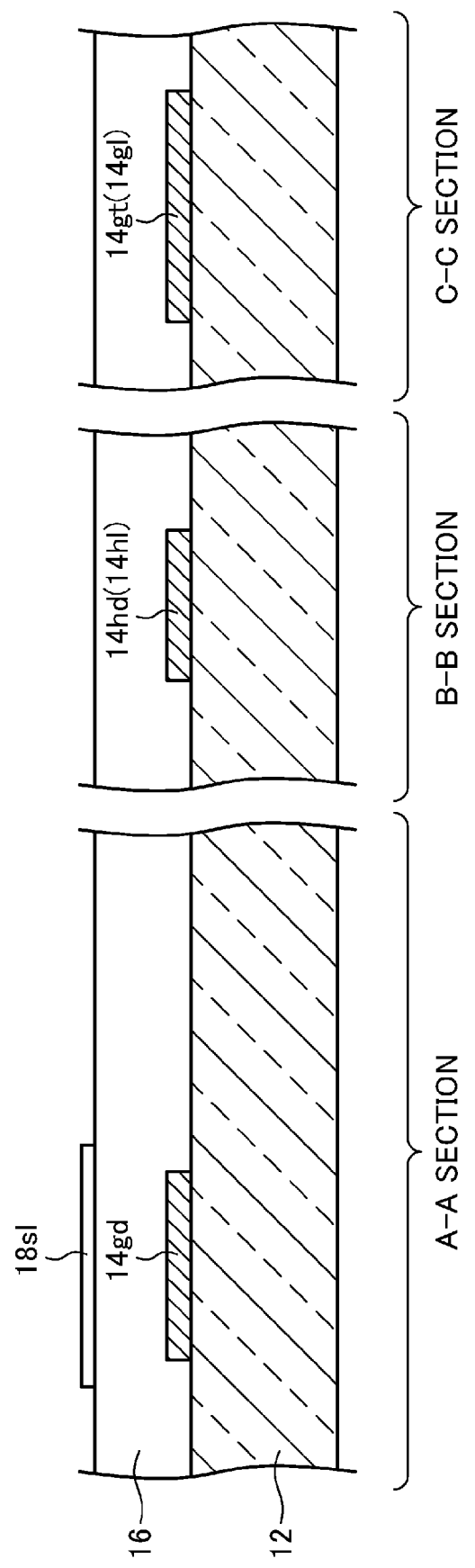
FIG. 7 is a cross-sectional view corresponding to FIG. 4, showing the state where an oxide semiconductor layer has been formed in a second patterning step in manufacturing of the TFT substrate.

An example of a method for manufacturing the TFT substrate 10 and the LCD device S will be described below with reference to FIGS. 5-12. FIGS. 5-12 are cross-sectional view corresponding to FIG. 4, where FIG. 5 shows a first patterning step in the manufacturing method of the TFT substrate 10, FIG. 6 shows a gate insulating film formation step in the manufacturing method of the TFT substrate 10, FIG. 7 shows a second patterning step in the manufacturing method of the TFT substrate 10, FIGS. 8-11 show a third patterning step in the manufacturing method of the TFT substrate 10, and FIG. 12 shows a fourth patterning step in the manufacturing method of the TFT substrate 10.

The manufacturing method of the LCD device S of the present embodiment includes a TFT substrate manufacturing step, a counter substrate manufacturing step, a bonding step, and a mounting step.

(TFT Substrate Manufacturing Step)

The TFT substrate manufacturing step includes first to fifth patterning steps.

(First Patterning Step)

For example, a titanium film, an aluminum film, a titanium film, etc. are sequentially formed by a sputtering method on an insulating substrate 12 such as a glass substrate prepared in advance, thereby forming a stacked conductive film. Then, by photolithography using a first photomask, a resist pattern is formed on the regions of the stacked conductive film where a gate line 14*gl* and a gate electrode 14*gd*, and a storage capacitor line 14*hl* and a lower electrode 14*hd* are to be formed. Thereafter, by using the resist pattern as a mask, the stacked conductive film is patterned by reactive ion etching (RIE) using a chlorine gas, which is a type of dry etching. Subsequently, delamination of the resist pattern and cleaning are performed by using a resist delamination solution, whereby the gate line 14gl and the gate electrode 14gd, and the storage capacitor line 14hl and the lower electrode 14hd are simultaneously formed as shown in FIG. 5.

(Gate Insulating Film Formation Step)

A silicon oxide film is formed by a CVD method over the substrate having the gate electrode 14gd, the lower electrode 14hd etc., thereby forming a gate insulating film 16 as shown in FIG. 6.

(Second Patterning Step)

A semiconductor film comprised of an In—Ga—Zn—O-based oxide semiconductor is formed by a sputtering method on the substrate having the gate insulating film 16. Then, a resist pattern is formed on the semiconductor film by photolithography using a second photomask. Thereafter, by using the resist pattern as a mask, the semiconductor film is patterned by wet etching using an oxalic acid solution. Subsequently, delamination of the resist pattern and cleaning are performed by using a resist delamination solution, whereby an oxide semiconductor layer 18sl formed as shown in FIG. 7.

(Third Patterning Step)

Figure 8:
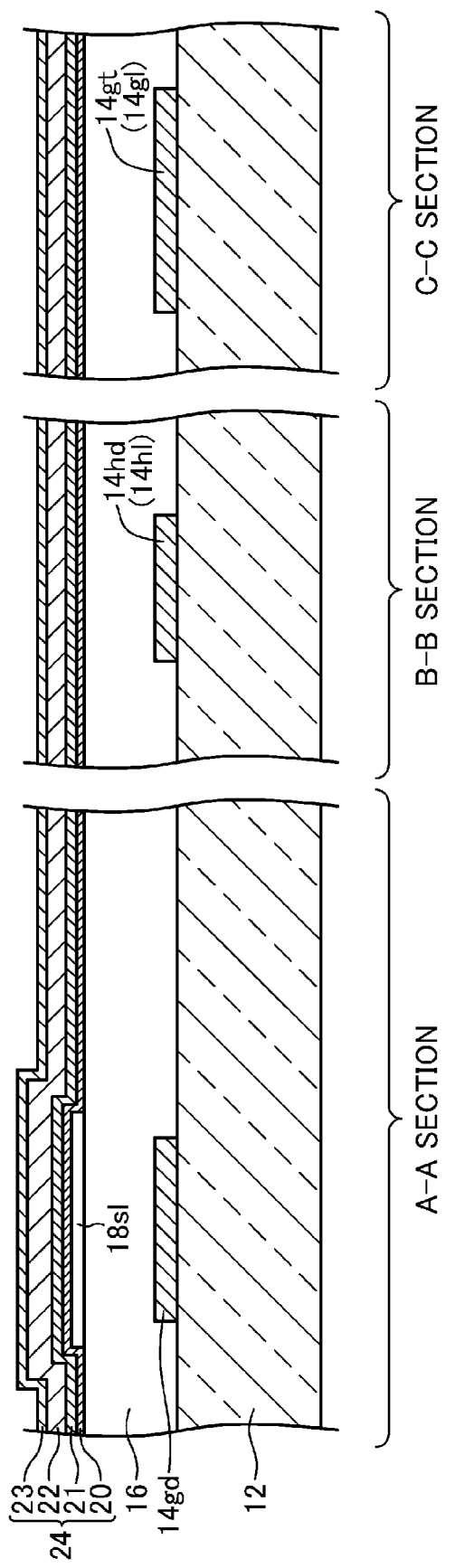
FIG. 8 is a cross-sectional view corresponding to FIG. 4, showing the state where a stacked conductive film has been formed in a third patterning step in manufacturing of the TFT substrate.

A titanium film 20 (thickness: e.g., about 20 nm), a molybdenum nitride film 21 (thickness: e.g., about 50 nm), an aluminum film 22 (thickness: e.g., about 150 nm), and a molybdenum nitride film 23 (thickness: e.g., about 100 nm) are sequentially formed by a sputtering method on the substrate having the oxide semiconductor layer 18sl, thereby forming a stacked conductive film 24 as shown in FIG. 8.

Figure 9:
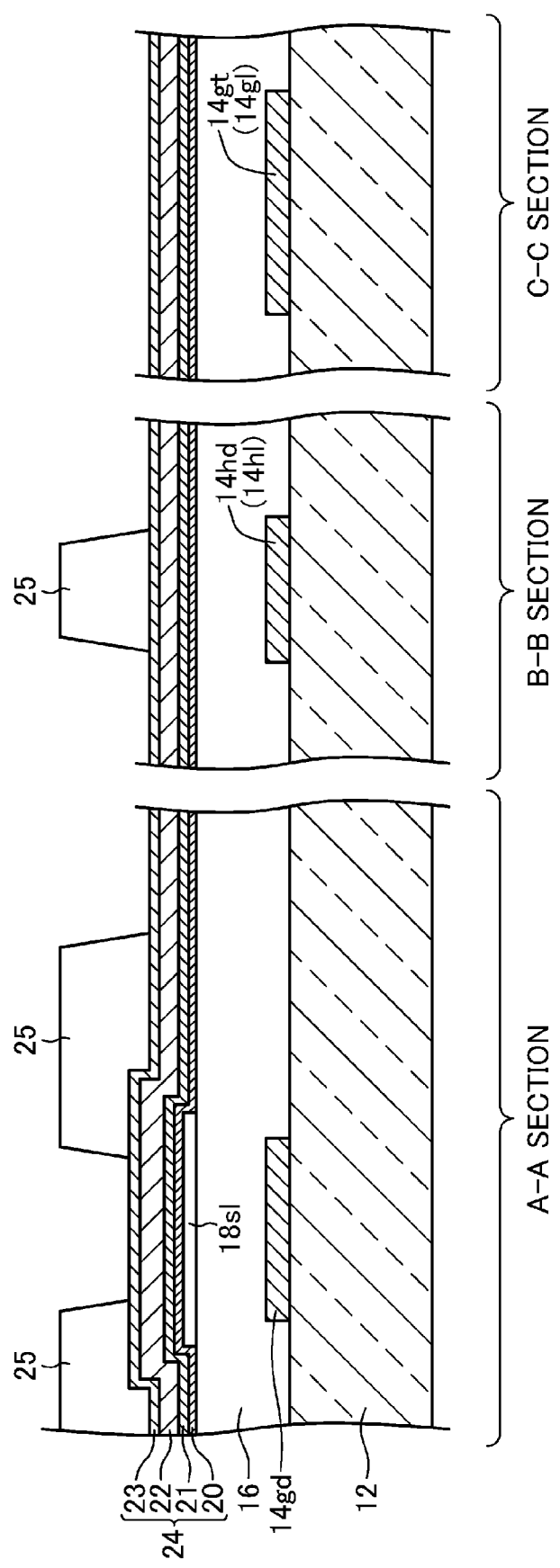
FIG. 9 is a cross-sectional view corresponding to FIG. 4, showing the state where a resist pattern has been formed in the third patterning step in manufacturing of the TFT substrate.

Then, as shown in FIG. 9, by photolithography using a third photomask, a resist pattern is formed on the regions of the stacked conductive film 24 where a source line 24sl and a source electrode 24sd, a drain electrode 24dd, and an upper electrode 24hd are to be formed.

Figure 10:
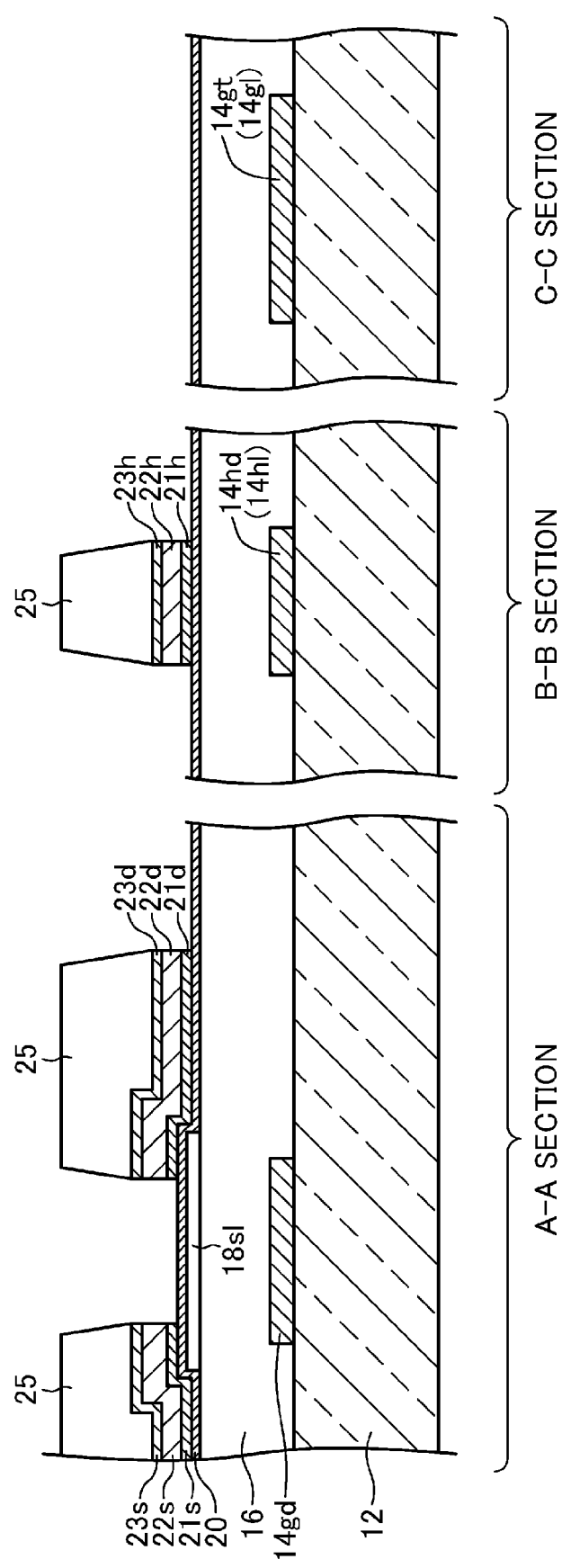
FIG. 10 is a cross-sectional view corresponding to FIG. 4, showing the state where a molybdenum nitride film, an aluminum film, and a molybdenum nitride film have been patterned in the third patterning step in manufacturing of the TFT substrate.

Thereafter, by using the resist pattern as a mask, the upper three layers of the stacked conductive film 24, namely the molybdenum nitride film 21, the aluminum film 22, and the molybdenum nitride film 23, are patterned by performing wet etching, e.g., at 40° C. for 60 seconds with a mixture of phosphoric acid, acetic acid, and nitric acid, thereby forming molybdenum nitride layers 21s, 21d, 21h, aluminum layers 22s, 22d, 22h, and molybdenum nitride layers 23s, 23d, 23h which form the source line 24sl and the source electrode 24sd, the drain electrode 24dd, and the upper electrode 24hd, as shown in FIG. 10. At this time, since the titanium film 20 has a thickness of, e.g., about 20 nm, the titanium film 20 has a satisfactory covering property (coverage) on the oxide semiconductor layer 18sl. Thus, the etchant can be prevented from penetrating into the oxide semiconductor layer 18sl when forming the molybdenum nitride layers 21s, 21d, 21h, the aluminum layers 22s, 22d, 22h, and the molybdenum nitride layers 23s, 23d, 23h.

Figure 11:
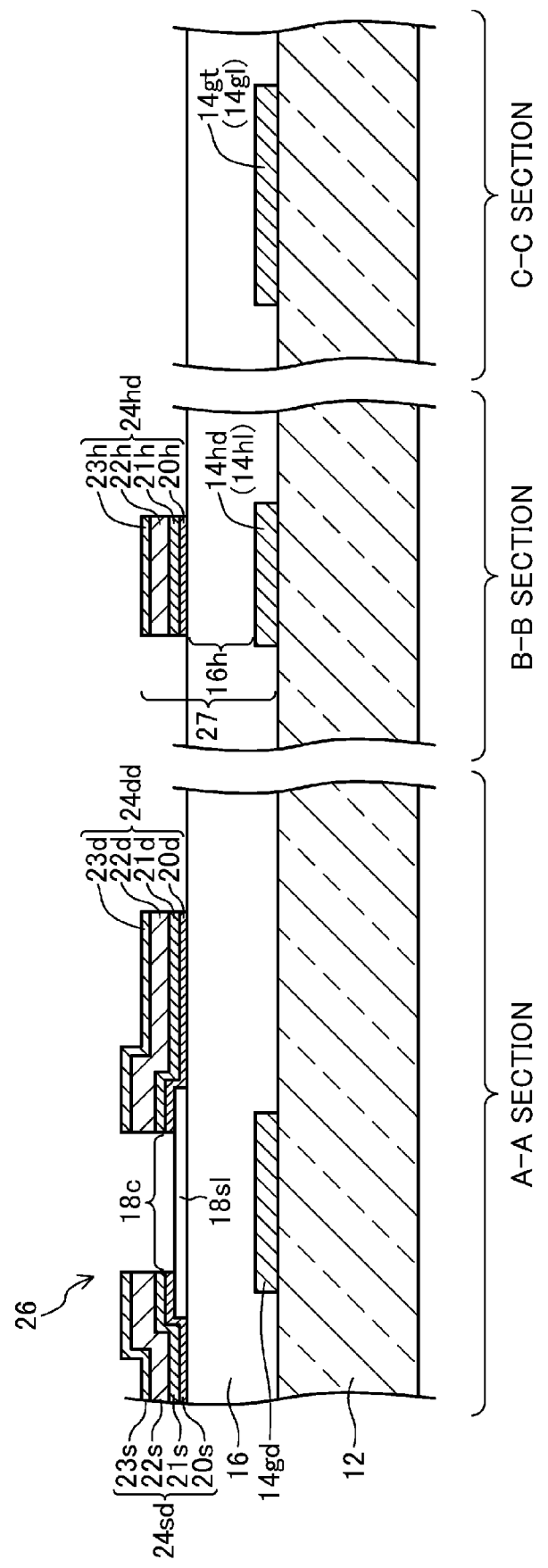
FIG. 11 is a cross-sectional view corresponding to FIG. 4, showing the state where a titanium film has been patterned to form a source electrode and a drain electrode in the third patterning step in manufacturing of the TFT substrate.
Figure 12:
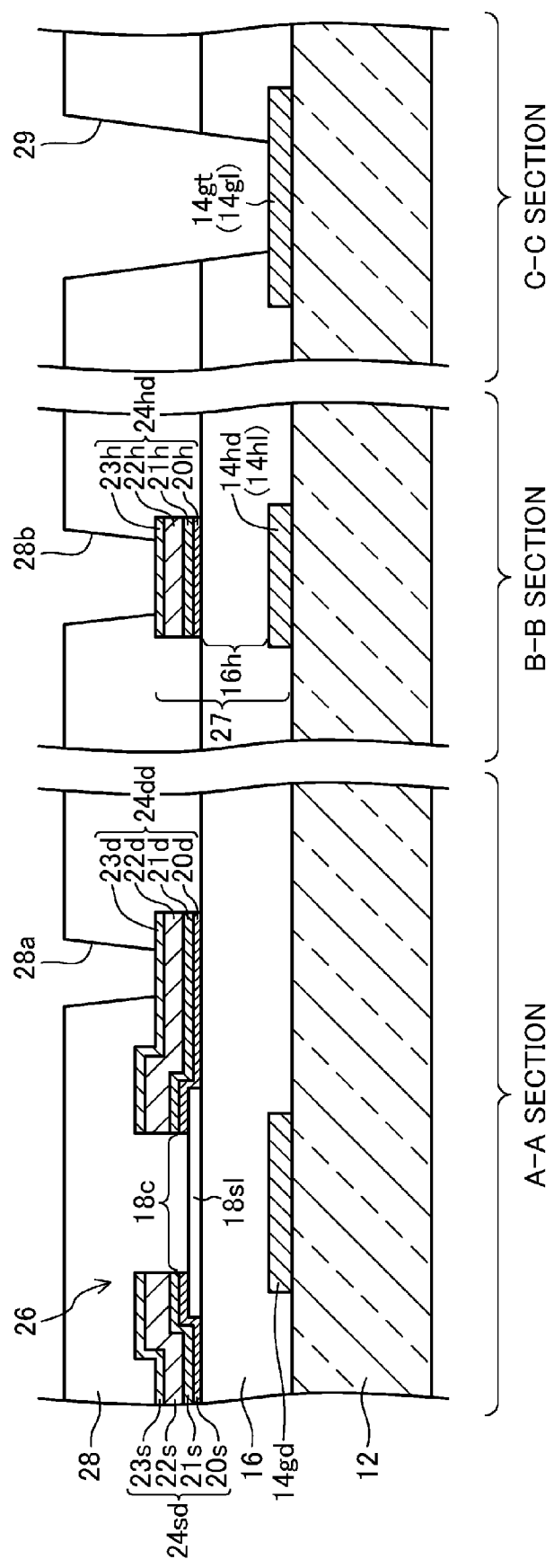
FIG. 12 is a cross-sectional view corresponding to FIG. 4, showing the state where a protective insulating film has been formed in a fourth patterning step in manufacturing of the TFT substrate.

Moreover, by using the resist pattern and the molybdenum nitride layers 21s, 21d, 21h, the aluminum layers 22s, 22d, 22h, and the molybdenum nitride layers 23s, 23d, 23h as a mask, the remaining titanium film 20 is patterned by RIE to simultaneously form the source line 24sl and the source electrode 24sd, the drain electrode 24dd, and the upper electrode 24hd, as shown in FIG. 11, thereby forming the TFT 26 and the storage capacitor 27. At this time, since the titanium film 20 has a thickness of, e.g., about 20 nm, patterning only the titanium film 20 by the RIE reduces the exposure time of a channel region 18c of the oxide semiconductor layer 18sl to plasma due to overetching that is caused by variation in thickness of the titanium film 20 upon formation of the titanium film 20. Thus, plasma damage to the channel region 18c is suppressed.

For example, the RIE is performed under the following etching conditions. A mixed gas of $Cl_2$ (flow rate: about 100 sccm) and $BCl_3$ (flow rate: about 100 sccm) is used as a source gas, a chamber pressure is about 4 Pa, and high frequency power is about 1,100 W.

(Fourth Patterning Step)

A silicon oxide film is formed by a CVD method on the substrate having the source electrode 24sd, the drain electrode 24dd, etc., thereby forming a protective insulating film 28.

Then, the substrate having the protective insulating film 28 is subjected to high temperature annealing in an anneal chamber. This high temperature annealing is performed at about 100° C. to 450° C. at an atmospheric pressure in an oxygen-containing atmosphere by using an oxygen gas as a carrier gas. Since the protective insulating film 28 comprised of silicon oxide typically has a higher oxygen transmission rate than, e.g., a silicon nitride film, oxygen of this annealing can be effectively supplied to the channel region 18c of the oxide semiconductor layer 18sl. The annealing is thus performed after formation of the protective insulating film 28. Accordingly, even if the channel region 18c of the oxide semiconductor layer 18sl has been exposed to plasma, and oxygen in the channel region 18c has been eliminated by the CVD method performed to form the protective insulating film 28, the oxygen deficiency in the oxide semiconductor layer 18sl is made up by the annealing, and characteristics of the semiconductor layer 18sl can be stabilized.

Thereafter, photolithography using a fourth photomask is performed on the annealed substrate to form a resist pattern on the regions of the protective insulating film 28 where contact holes 28a, 28b, 28c, 29 are to be formed. By using the resist pattern as a mask, the protective insulating film 28 is patterned by RIE using a fluorine gas. Subsequently, delamination of the resist pattern and cleaning are performed by using a resist delamination solution, thereby forming the contact holes 28a, 28b, 28c, 29 as shown in FIG. 12.

(Fifth Patterning Step)

A transparent conductive film such as, e.g., ITO is formed by a sputtering method on the substrate having the contact holes 28a, 28b, 28c, 29 in the protective insulating film 28. Then, by photolithography using a fifth photomask, a resist pattern is formed on the regions of the transparent conductive film where a pixel electrode 30pd, a gate connection electrode 30gd, and a source connection electrode 30sd are to be formed. By using the resist pattern as a mask, the transparent conductive film is patterned by wet etching using an oxalic acid solution. Subsequently, delamination of the resist pattern and cleaning are performed by using a resist delamination solution, thereby forming the pixel electrode 30pd, the gate connection electrode 30gd, and the source connection electrode 30sd.

The TFT substrate 10 shown in FIG. 4 can be manufactured in this manner.

(Counter Substrate Manufacturing Step)

First, an insulating substrate such as a glass substrate is coated with, e.g., a black-colored photosensitive resin by a spin coating method or a slit coating method. Next, the coated film is exposed to light via a photomask, and then is developed, thereby patterning the photosensitive resin into a black matrix.

Thereafter, the substrate having the black matrix is coated with, e.g., a red, green, or blue-colored negative acrylic photosensitive resin. The coated film is exposed to light via a photomask, and then is developed, thereby patterning the photosensitive resin into a colored layer of a selected color (e.g., a red layer). A similar process is repeated to form colored layers of the other two colors (e.g., a green layer and a blue layer). Color filters are formed in this manner.

Then, for example, an ITO film is formed by a sputtering method on the substrate having the color filters, thereby forming a common electrode. Subsequently, the substrate having the common electrode is coated with a positive phenol novolac photosensitive resin by a spin coating method. The coated film is exposed to light via a photomask, and then is developed, thereby patterning the photosensitive resin into a photo spacer.

The counter substrate 50 can be manufactured in this manner.

(Bonding Step)

First, the surface of the TFT substrate 10 is coated with a polyimide resin by a printing method, and the coated film is then subjected to baking and rubbing processes to form an alignment film 55. The surface of the counter substrate 50 is also coated with a polyimide resin by a printing method, and the coated film is then subjected to baking and rubbing processes to form an alignment film 56.

Thereafter, by using, e.g., a dispenser etc., a sealant 51 made of an ultraviolet (UV)-curable, thermosetting resin etc. is applied in the shape of a rectangular frame to the counter substrate 50 having the alignment film 56. Subsequently, a predetermined amount of liquid crystal material is dropped onto a region inside the sealant 51 on the counter substrate 50.

Then, the counter substrate 50 having the liquid crystal material dropped thereon and the TFT substrate 10 having the alignment film 55 are bonded together under a reduced pressure, and the bonded body of the counter substrate 50 and the TFT substrate 10 is exposed to an atmospheric pressure to press the surfaces of the bonded body. Moreover, the sealant 51 of the bonded body is irradiated with UV light to preliminarily cure the sealant 51, and then the resultant bonded body is heated to permanently cure the sealant 51, whereby the TFT substrate 10 is bonded to the counter substrate 50.

Thereafter, polarizers 57, 58 are respectively bonded to the outer surfaces of the TFT substrate 10 and the counter substrate 50 that have been bonded together.

(Mounting Step)

Anisotropic conductive films (ACFs) are formed on the terminal region 10*a* of the bonded body having the polarizers 57, 57 bonded to both surfaces thereof. Then, gate driver IC chips 53 and source driver IC chips 54 are thermocompression bonded to the terminal region 10*a* with the ACFs interposed therebetween, thereby mounting the driver IC chips 53, 54 on the bonded body.

The LCD device S can be manufactured by the steps described above.

Advantages of Embodiment

According to the present embodiment, metal particles of the aluminum layer 22*s*, 22*d* are less likely to diffuse into the molybdenum nitride layers 21*s*, 23*s*, 21*d*, 23*d* than into the titanium layer 20*s*, 20*d*. Thus, when annealing the oxide semiconductor layer 18*sl*, the metal particles of the aluminum layer 22*s*, 22*d* that causes a redox reaction with the oxide semiconductor layer 18*sl* do not diffuse into the molybdenum nitride layers 21*s*, 23*s*, 21*d*, 23*d*, and the lower molybdenum nitride layer 21*s*, 21*d* can prevent diffusion the metal particles of the aluminum layer 22*s*, 22*d* into the lowermost titanium layer 20*s*, 20*d*. The titanium layer 20*s*, 20*d* is less likely to cause a redox reaction with oxide semiconductor than the aluminum layer 22*s*, 22*d* does. Accordingly, when performing the annealing, the titanium layer 20*s*, 20*d* is less likely to cause a redox reaction with oxide semiconductor, and reduction and metallization of the oxide semiconductor layer 18*sl* by the source electrode 24*sd* and the drain electrode 24*dd* can be prevented. Thus, the annealing can satisfactorily repair lattice defects in the oxide semiconductor layer 18*sl*, and reliably stabilize characteristics of the oxide semiconductor layer 18*sl*. This stably ensures satisfactory characteristics of the channel etch TFT 26 using the oxide semiconductor layer 18*sl*. As a result, display quality can be improved while implementing low-cost manufacturing of the TFT substrate 10 by using a total of five photomasks.

The above embodiment is described with respect to an example in which the source electrode 24*sd* and the drain electrode 24*dd* has a stacked structure (MoN/Al/MoN/Ti) of the titanium layer 20*s*, 20*d* as the first conductive layer, the molybdenum nitride layer 21*s*, 21*d* as the second conductive layer, the aluminum layer 22*s*, 22*d* as the third conductive layer, and the molybdenum nitride layer 23*s*, 23*d* as the fourth conductive layer. However, the present invention is not limited to this.

That is, instead of titanium (Ti), the first conductive layers 20*s*, 20*d* may be comprised of a refractory metal such as titanium nitride (TiN), titanium oxide (TiO), or an alloy primarily containing titanium (Ti). Alternatively, the first conductive layers 20*s*, 20*d* may be comprised of a Group 4 metal element, an alloy primarily containing a Group 4 metal element, or a nitride or oxide thereof.

Instead of molybdenum nitride (MoN), the second conductive layers 21*s*, 21*d* may be comprised of a refractory metal such as molybdenum (Mo) or an alloy primarily containing molybdenum, or chromium (Cr), niobium (Nb), tantalum (Ta), or tungsten (W), an alloy primarily containing any of these elements, or a nitride or oxide thereof. Alternatively, the second conductive layers 21*s*, 21*d* may be comprised of a Group 5 or Group 6 metal element, an alloy primarily containing a Group 5 or Group 6 metal element, or a nitride or oxide thereof.

Instead of aluminum (Al), the third conductive layers 22*s*, 22*d* may be comprised of copper (Cu) or silver (Ag). Alternatively, the third conductive layers 22*s*, 22*d* may be comprised of other low resistance metal material having a specific resistance of 5 μΩ·cm or less.

Instead of molybdenum nitride (MoN), the fourth conductive layers 23*s*, 23*d* may be comprised of a refractory metal such as molybdenum (Mo) or an alloy primarily containing molybdenum, or chromium (Cr), niobium (Nb), tantalum (Ta), or tungsten (W), an alloy primarily containing any of these elements, or a nitride or oxide thereof. Alternatively, the fourth conductive layers 23*s*, 23*d* may be comprised of a Group 5 or Group 6 metal element, an alloy primarily containing a Group 5 or Group 6 metal element, or a nitride or oxide thereof. The fourth conductive layers 23*s*, 23*d* may be comprised of any metal material as long as the difference in ionization tendency between the fourth conductive layer and the third conductive layer 22*d* and between the fourth conductive layer and the pixel electrode 30*pd* is smaller than that between the third conductive layer 22*d* and the pixel electrode 30*pd*.

Specific other examples of the stacked structure for the source electrode 24*sd* and the drain electrode 24*dd* include a stacked structure (MoN/Al/MoN/W) in which the lowermost titanium layer 20*s*, 20*d* is replaced with a tungsten layer, and a stacked structure (MoN/Al/MoN/Ta) in which the lowermost titanium layer 20*s*, 20*d* is replaced with a tantalum layer, etc.

The fourth conductive layers 23*sd*, 23*dd* may be eliminated if the level of galvanic corrosion is low.

In this case, examples of the stacked structure include a stacked structure (Cu/MoN/Ti) having a titanium layer as the first conductive layer, a molybdenum nitride layer as the second conductive layer, and a copper layer as the third conductive layer, a stacked structure (Cu/MoN/W) in which the titanium layer of the stacked structure (Cu/MoN/Ti) is replaced with a tungsten layer, and a stacked layer (Cu/MoN/Ta) in which the titanium layer of the stacked structure (Cu/MoN/Ti) is replaced with a tantalum layer.

The above embodiment is described with respect to the TFT using the In—Ga—Zn—O-based oxide semiconductor layer. However, the present invention is also applicable to TFT substrates including TFTs using other oxide semiconductor layers such as indium silicon zinc oxide (In—Si—Zn—O)-based, indium aluminum zinc oxide (In—Al—Zn—O)-based, tin silicon zinc oxide (Sn—Si—Zn—O)-based, tin aluminum zinc oxide (Sn—Al—Zn—O)-based, tin gallium zinc oxide (Sn—Ga—Zn—O)-based, gallium silicon zinc oxide (Ga—Si—Zn—O)-based, gallium aluminum zinc oxide (Ga—Al—Zn—O)-based, indium copper zinc oxide (In—Cu—Zn—O)-based, tin copper zinc oxide (Sn—Cu—Zn—O)-based, tin oxide (Sn—O)-based, and indium oxide (In—O)-based oxide semiconductor.

In the present embodiment, in the TFT substrate manufacturing step, the annealing is performed between formation of the protective insulating film 28 and formation of the contact holes 28a, 28b, 28c, 29 in the protective insulating film 28. However, this annealing may be performed before formation of the protective insulating film 28 or after formation of the contact holes 28a, 28b, 28c, 29 in the protective insulating film 28 as long as this annealing is performed after formation of the source electrode 24sd and the drain electrode 24dd.

Although the TFT substrate 10 forming the transmissive LCD device S is described in the above embodiment, the present invention is not limited to this, and the TFT substrate 10 of the present invention is also applicable to reflective or transflective LCD devices, other various display devices such as an organic electroluminescence (EL) display device, and manufacturing methods thereof.

Although the preferred embodiment of the present invention is described above, the technical scope of the present invention is not limited to that described in the above embodiment. It should be understood by those skilled in the art that the above embodiment is by way of illustration only, and various modifications can be made to the combinations of the components and the processes, and such modifications are within the scope of the present invention.

Industrial Applicability

As described above, since satisfactory characteristics are stably ensured in the channel etch TFT using the oxide semiconductor layer, the present invention is useful for TFT substrates, various display devices such as an LCD device and an organic EL display device including the same, and manufacturing methods thereof.

DESCRIPTION OF REFERENCE CHARACTERS

S Liquid Crystal Display
10 TFT Substrate (Thin Film Transistor Substrate)
12 Insulating Substrate (Base Substrate)
14gd Gate Electrode
16 Gate Insulating Film
18sl Oxide Semiconductor Layer
20 Titanium Film (First Conductive Film)
21 Molybdenum Nitride Film (Second Conductive Film)
22 Aluminum Film (Third Conductive Film)
24 Stacked Conductive Film
24sd Source Electrode
24dd Drain Electrode
20s, 20d, 20h Titanium Layer (First Conductive Layer)
21s, 21d, 21h Molybdenum Nitride Layer (Second Conductive Layer)
22s, 22d, 22h Aluminum Layer (Third Conductive Layer)
23s, 23d, 23h Molybdenum Nitride Layer (Fourth Conductive Layer)
26 TFT (Thin Film Transistor)
28 Protective Insulating Film
28a, 28b, 28c, 29 Contact Hole
30pd Pixel Electrode
50 Counter Substrate
52 Liquid Crystal Layer

The invention claimed is:

1. A thin film transistor substrate, comprising:
   a base substrate; and
   a thin film transistor having a gate electrode provided on the base substrate, a gate insulating film provided so as to cover the gate electrode, a semiconductor layer comprised of an oxide semiconductor and provided on the gate insulating film so as to overlap the gate electrode, and a source electrode and a drain electrode which are provided on the gate insulating film so as to face each other on the semiconductor layer and so that a part of the source electrode and a part of the drain electrode are connected to the semiconductor layer, wherein
   the source electrode and the drain electrode have a stack of a first conductive layer, a second conductive layer, and a third conductive layer,
   the third conductive layer is comprised of a low resistance metal that causes a redox reaction with the oxide semiconductor,
   the first conductive layer directly contacts the semiconductor layer, is formed by dry etching, and is comprised of a refractory metal including a Group 4 metal element that is less likely to cause the redox reaction with the oxide semiconductor than the third conductive layer does, an alloy primarily containing the Group 4 metal element, or a nitride or oxide thereof,
   the second conductive layer is comprised of a refractory metal including a Group 5 or Group 6 metal element into which metal particles of the third conductive layer are less likely to diffuse than into the first conductive layer, an alloy primarily containing the Group 5 or Group 6 metal element, or a nitride or oxide thereof, and
   the semiconductor layer is formed by performing annealing in an oxygen-containing atmosphere after formation of the source electrode and the drain electrode.

2. The thin film transistor substrate of claim 1, wherein
   the first conductive layer contains titanium,
   the second conductive layer contains at least one element selected from molybdenum, chromium, niobium, tantalum, and tungsten, and
   the third conductive layer contains at least one element selected from aluminum, copper, and silver.

3. The thin film transistor substrate of claim 1 wherein
   the thin film transistor is covered by a protective insulating film comprised of silicon oxide.

4. The thin film transistor substrate of claim 1, wherein
   the gate insulating film is comprised of silicon oxide.

5. The thin film transistor substrate of claim 1, further comprising:
   a pixel electrode provided for each thin film transistor, and connected to the drain electrode of the thin film transistor,
   the source electrode and the drain electrode further have a fourth conductive layer on the third conductive layer, and the fourth conductive layer of the drain electrode is directly connected to the pixel electrode, and a difference in ionization tendency between the fourth conductive layer and the pixel electrode and between the fourth conductive layer and the third conductive layer is smaller than that between the pixel electrode and the third conductive layer.

6. The thin film transistor substrate of claim 1, wherein the first conductive layer has a thickness in a range of 5 nm to 50 nm, both inclusive.

7. The thin film transistor substrate of claim 1, wherein the semiconductor layer is comprised of an indium gallium zinc oxide-based oxide semiconductor.

8. A liquid crystal display device, comprising:
the thin film transistor substrate of claim 1;
a counter substrate placed so as to face the thin film transistor substrate; and
a liquid crystal layer provided between the thin film transistor substrate and the counter substrate.

9. A method for manufacturing the thin film transistor substrate of claim 1, comprising:
a first patterning step of forming the gate electrode by forming a conductive film on the base substrate and patterning the conductive film by using a first photomask;
a gate insulating film formation step of forming the gate insulating film so as to cover the gate electrode;
a second patterning step of forming the semiconductor layer by forming on the gate insulating film a semiconductor film comprised of an oxide semiconductor, and patterning the semiconductor film by using a second photomask; and
a third patterning step of forming the source electrode and the drain electrode by sequentially forming a first conductive film, a second conductive film, and a third conductive film to form a stacked conductive film so as to cover the semiconductor layer, patterning the second and third conductive films of the stacked conductive film by wet etching using a third photomask, and then patterning the remaining first conductive film by dry etching, wherein
the first conductive film is comprised of a refractory metal including a Group 4 metal element, an alloy primarily containing the Group 4 metal element, or a nitride or oxide thereof, the second conductive layer is comprised of a refractory metal including a Group 5 or Group 6 metal element, an alloy primarily containing the Group 5 or Group 6 metal element, or a nitride or oxide thereof, and the third conductive layer is comprised of a low resistance metal that causes a redox reaction with the oxide semiconductor, and
the substrate having both the source electrode and the drain electrode formed thereon is subjected to annealing in an oxygen-containing atmosphere.

10. The method of claim 9, further comprising:
a fourth patterning step of forming a contact hole at a position corresponding to the drain electrode by forming a protective insulating film so as to cover the source electrode and the drain electrode and patterning the protective insulating film by using a fourth photomask; and
a fifth patterning step of forming a pixel electrode so as to connect to the drain electrode, by forming on the protective insulating film a conductive film so as to connect to the drain electrode via the contact hole, and patterning the conductive film by using a fifth photomask.

11. The method of claim 10, wherein
the annealing is performed after formation of the protective insulating film in the fourth patterning step.

12. The method of claim 9, wherein
the oxide semiconductor is indium gallium zinc oxide-based oxide semiconductor.

\* \* \* \* \*